United States Patent [19]

Takagi et al.

[11] Patent Number: 5,325,574
[45] Date of Patent: Jul. 5, 1994

[54] METHOD OF FORMING A QUARTZ OSCILLATOR TEMPERATURE SENSOR

[75] Inventors: Michiaki Takagi; Mitsuru Nagai, both of Suwa, Japan

[73] Assignee: Seiko Epson Corporation, Tokyo, Japan

[21] Appl. No.: 113,558

[22] Filed: Aug. 27, 1993

Related U.S. Application Data

[63] Continuation-in-part of Ser. No. 782,771, Oct. 17, 1991, Pat. No. 5,265,311, which is a continuation of Ser. No. 563,879, Aug. 6, 1990, abandoned, which is a continuation of Ser. No. 265,865, Oct. 6, 1988, abandoned.

[30] Foreign Application Priority Data

| Feb. 27, 1987 | [JP] | Japan | 62-28640 |
| Sep. 8, 1987 | [JP] | Japan | 62-224428 |
| Nov. 20, 1987 | [JP] | Japan | 62-29560 |
| Nov. 20, 1987 | [JP] | Japan | 62-293562 |
| Aug. 28, 1992 | [JP] | Japan | 4-230203 |

[51] Int. Cl.$^5$ .................................. H01L 41/22
[52] U.S. Cl. ................... 29/25.35; 310/361; 310/370
[58] Field of Search ............ 29/25.35; 310/321, 370, 310/361

[56] References Cited

U.S. PATENT DOCUMENTS

| 2,503,429 | 5/1950 | Ziegler | 310/344 |
| 2,577,576 | 12/1951 | Glickman | 310/344 |
| 2,656,473 | 10/1953 | Warner | 310/353 |
| 3,131,388 | 1/1976 | Hafner | 310/344 |
| 3,221,189 | 11/1965 | Brandt | 310/353 |
| 3,970,880 | 7/1976 | Deutschmann | 310/353 |
| 4,110,655 | 8/1978 | Hata | 310/344 |
| 4,266,156 | 5/1981 | Kizaki | 310/344 |
| 4,293,986 | 10/1981 | Kobayashi | 310/344 |
| 4,620,438 | 11/1986 | Howng | 310/338 |
| 4,703,656 | 11/1987 | Bhardwaj | 310/336 |
| 4,746,831 | 5/1988 | Ichino | 310/327 |
| 4,772,130 | 9/1988 | Ueda et al. | 29/25.35 X |
| 4,986,670 | 1/1991 | Uichiyama | 374/117 |
| 5,200,714 | 4/1993 | Hayashi | 331/66 |

FOREIGN PATENT DOCUMENTS

| 54-35870 | 3/1979 | Japan . |
| 54-43490 | 4/1979 | Japan . |
| 56-157827 | 11/1981 | Japan . |
| 57-112119 | 7/1982 | Japan . |
| 58-168317 | 10/1983 | Japan . |
| 59-36410 | 2/1984 | Japan . |
| 678471 | 9/1991 | Switzerland . |

*Primary Examiner*—Carl E. Hall
*Attorney, Agent, or Firm*—Stroock & Stroock & Lavan

[57] ABSTRACT

A quartz oscillator temperature sensor which measures temperature based on the change in resonance or oscillation frequency of a quartz oscillator with the change in temperature of the oscillator can be constructed by cutting a piece of quartz from a wafer with a thickness of about 80 to 150 μm by rotating the plane of the crystal defined by the electrical and mechanical axes 15 to 25° about the electrical axis and then forming the wafer into a quartz tuning fork. The tuning fork is housed in a case sealed with a stem and coupled to electrical leads with heat resistent solder formed with more than about 90 wt % Pb and less than 10% Sn. The area within the case should be at a substantially high vacuum.

7 Claims, 5 Drawing Sheets

FIG.9

METHOD OF FORMING A QUARTZ OSCILLATOR TEMPERATURE SENSOR

CROSS REFERENCE TO RELATED APPLICATIONS

This application is a continuation-in-part of U.S. Ser. No. 07/782,771 filed Oct. 17, 1991, which is a continuation of U.S. Ser. No. 07/563,879 filed Aug. 6, 1990, now abandoned, which is a continuation of U.S. Ser. No. 07/265,865, filed Oct. 6, 1988, now abandoned.

BACKGROUND OF THE INVENTION

The invention relates generally to temperature sensors and more particularly to a temperature sensor including a quartz oscillator for determining temperature by measuring the resonance or oscillation frequency of the quartz oscillator.

Examples of conventional quartz oscillators for determining temperatures are described in Japanese Patent Publication Nos. 61-29652 and 1-29089. These publications specify a wide range of orientations of the quartz wafer and quartz oscillators having a frequency-temperature characteristic with a large first-order coefficient. However, neither publication describes various characteristics which must be taken into account in order to fabricate suitable quartz oscillator temperature sensors so that reliable sensors can be fabricated with suitable consistency. Additional details regarding quartz oscillator temperature sensors are described in U.S. Pat. Nos. 5,200,714 and 4,987,670, the contents of which are incorporated herein by reference. The contents of pending application Ser. No. 07/782,771 is also incorporated herein by reference.

The following characteristics affect the suitability of a quartz oscillator temperature sensor. The angular orientation of the oscillator can affect the equivalent series—resonance resistance value (CI value) of the oscillator. The quartz oscillator can have a large CI value, or it can have a large variation in CI value with change in temperature, depending on the particular angular orientation of the oscillator. If an oscillator is constructed with an improper angular orientation, oscillation stoppage can occur at high temperatures.

Another drawback can be the presence of fin shaped structures on the quartz tuning fork. Fins result from imprecise manufacturing techniques and can remain on the outer surface after the tuning fork is formed by a photo-etching method, for example. Fins can lead to unstable oscillation properties.

If a flexural oscillation mode is used that involves a high-order oscillation mode, many conventional quartz oscillators exhibit what is commonly referred to as "spurious" phenomena. Spurious phenomena is an abnormality in oscillation which occurs when the frequency coincides with an unnecessary oscillation mode at certain temperatures within the usable temperature range of the quartz oscillator. In order to detect spurious phenomena, the frequency-temperature characteristics of the oscillator must be checked precisely over the entire usable temperature range.

Accordingly, in order to overcome deficiencies in conventional quartz oscillator temperature measuring devices, it is necessary to provide a method and apparatus for eliminating deficiencies in equivalent series-resonance resistance caused by unsuitable angular orientation; unstable oscillation resulting from the presence of fins on the oscillator; and the existence of spurious phenomena. These and other drawbacks of conventional quartz oscillator temperature measuring apparatuses can be overcome by constructing a temperature measuring apparatus in accordance with the invention.

SUMMARY OF THE INVENTION

Generally speaking, in accordance with the invention, a quartz oscillator temperature sensor is provided for determining temperatures based on the change in resonance or oscillation frequency of a quartz oscillator with changes in the temperature of the oscillator. A suitable quartz oscillator for a temperature sensor is constructed by cutting a piece of quartz for the oscillator at a preferred orientation angle, forming a tuning fork-shaped oscillator with appropriate dimensions; shaping the tuning fork in a manner to reduce the number of surface defects; coupling the excitation electrodes in a suitable manner and enclosing the oscillator in a proper case.

Figures 2, 3:
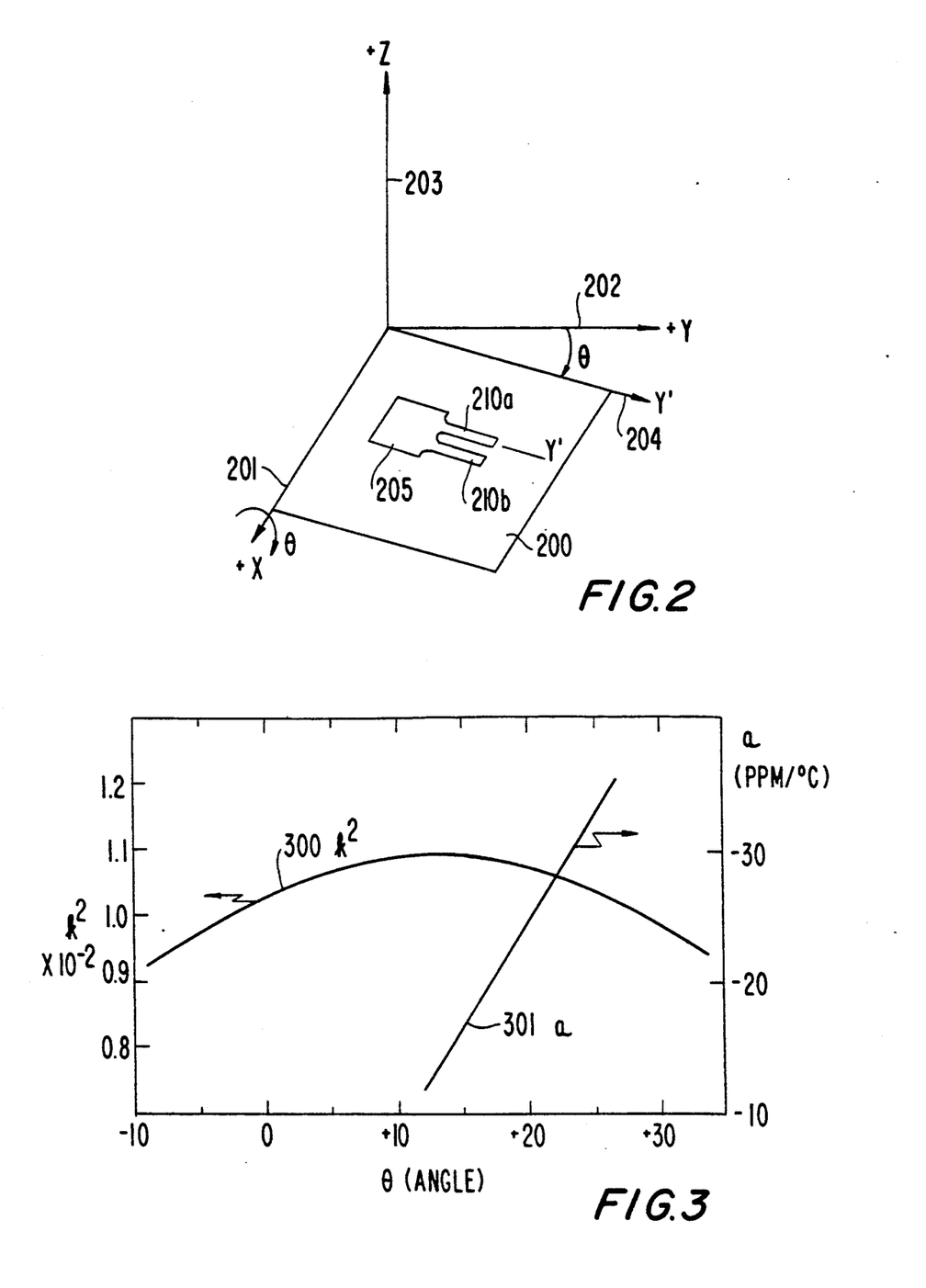
FIG. 2 illustrates the orientation directions for forming a quartz oscillator in accordance with the invention.
FIG. 3 is a three dimensional graph showing the change of the electro-mechanical coupling coefficient ("$k^2$") and the change of the first order temperature coefficient ("a") of a quartz oscillator constructed in accordance with the invention, with a change in angle of rotation from the mechanical axis of which the oscillator is cut from a quartz crystal.

In a preferred embodiment of the invention, the oscillator is formed from a quartz wafer with a thickness of about 80 to 150 μm. The wafer is cut from an e quartz single crystal at an orientation obtained by rotating a Z-cut wafer having a principle plane defined by an electrical axis (+X) and a mechanical axis (+Y) as shown in FIG. 2. The plane of the wafer is rotated about the electrical axis (T) in a clockwise direction by an angle of about 15 to 25°. This range of rotation assures a substantially maximum electro-mechanical coupling coefficient. The quartz wafer is then formed into a tuning fork-shape with the arms parallel with a Y' axis serving as the mechanical axis after rotation. The ratio of arm length to arm width is preferably about 10:1 to 20:1.

A housing for the oscillator is formed with a case and stem configuration with the oscillator within the case and electrical leads extending through the stem into the case. At least one portion of the case and stem is plated with a heat resistant Pb-Sn solder which preferably contains not less than 90 wt % Pb. An inner lead of the quartz oscillator which passes through the stem has at least a portion thereof plated with such solder. The quartz is adhered to the inner lead by the solder and the case and stem are press-combined with the solder therebetween.

Accordingly, it is an object of the invention to provide an improved quartz oscillator for measuring temperature and method of formation which overcomes deficiencies of the prior art.

Another object of the invention is to provide a quartz oscillator temperature sensor with a suitable equivalent series-resonance resistance value.

Another object of the invention is to provide a quartz oscillator temperature sensor having a suitably low amount of fin-like imperfections on the surface of the oscillator.

A further object of the invention is to provide a quartz oscillator temperature sensor which does not exhibit unacceptable spurious phenomena.

Still another object of the invention is to provide a quartz oscillator temperature sensor having high accuracy and reliability at a suitably low price.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

A quartz oscillator formed in accordance with the invention is well suited for use as a sensor in an apparatus for measuring temperature. The frequency or resonance of the oscillator will vary with temperature and the temperature of the oscillator can be determined by measuring the change in oscillation (frequency or resonance). The electronics and structures of such an apparatus are well known and will not be detailed herein in the interest of brevity.

The oscillator portion of the temperature sensor should be formed in the shape of a tuning fork with a pair of parallel arms extending from a base portion. The tuning fork is formed from a substantially flat thin quartz wafer which is cut from a single quartz crystal. By cutting the wafer at a preferred orientation, the oscillator will have a small equivalent series-resonance resistance whose characteristics will vary only slightly with changes in temperature.

It is also important to form the arms of the tuning fork without an unacceptable amount of defects, commonly referred to as fins, which can affect the temperature-oscillation characteristics. By forming the oscillator and the sensor including the oscillator in accordance with the invention, a small yet low cost and highly precise temperature measuring apparatus can be provided.

Figure 1:
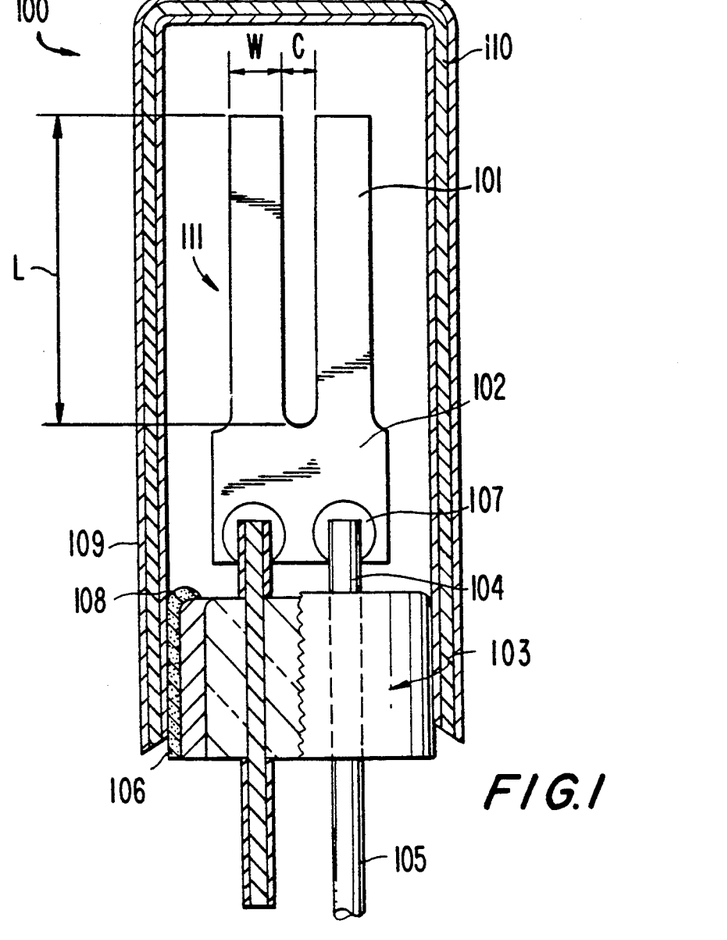
FIG. 1 is a cross-sectional view of an apparatus including a quartz oscillator for measuring temperatures constructed in accordance with the invention.

A quartz oscillator temperature sensor 100 for detecting temperatures and constructed in accordance with a preferred embodiment of the invention is shown in FIG. 1. Sensor 100 includes a case 110 and a stem 103 with seals an open end of case 110. A quartz oscillator tuning fork 111 formed with a base 102 and a pair of parallel arms 101 extending from base 102 is within the enclosure defined by case 110 and stem 103.

Stem 103 includes a pair of outer leads 105 for connecting to peripheral electronic devices and a pair of inner leads 104 which are coupled to base 102 of quartz tuning fork 111 with solder 107. Stem 103 includes a heat-resistant solder plating 106. Case 110 includes an inner heat-resistant solder plating 108 and an outer heat-resistance solder plating 109. Solder plating 106 is in contact with solder plating 108.

Quartz tuning fork 111 should be cut from an alpha quartz single crystal in a preferred orientation to provide enhanced properties for use in temperature measuring apparatus. Referring to FIG. 2, the alpha quartz crystal will have an electrical axis 201 in the +X direction, a mechanical axis 202 in the +Y direction and an optical axis 203 in the +Z direction. A quartz wafer 200 for forming a tuning fork shaped oscillator 205 is cut from a plane obtained by rotating the XY plane in the $-Z$ direction through an angle $\theta$. This plane is referred to as the XY' plane. Y' is identified by reference numeral 204 and forms angle $\theta$ with Y axis 203. Electrical axis 201, mechanical axis 202 and optical axis 203 are fundamental crystal axes of the alpha quartz single crystal.

Tuning fork shaped quartz piece 205 has a principal plane within the plane of quartz wafer 200. The longitudinal direction a pair of arms 210a and 210b are substantially parallel with the Y' axis. It is preferable that the longitudinal dimension of arms 210a and 210b are within several degrees, preferably 5 or less, from the direction of axis Y'. Quartz wafer 200 is preferably cut with a thickness of about 80 to 150 μm and angle $\theta$ is selected in the range of about 15 to 25°. After cutting wafer 200 from the alpha quartz single crystal, quartz wafer 200 is subjected to surface lapping and finishing. Tuning fork 205 can then be formed from wafer 200 in the following manner.

A chromium underlayer is formed on the front and back planar surfaces of quartz wafer 200. A gold thin film is then formed by deposition, sputtering or a similarly precise method on the chromium underlayer. Thereafter, a photo process including resist-coating and exposing steps are performed on the planar surfaces of the quartz wafer to form the Cr underlayer and the gold thin film to the tuning fork shaped configuration. Thereafter, outer-shaped etching is formed with hydrofluoric acid, a mixture of hydrofluoric acid and ammonium fluoride (NH4F) or other suitable etching material. The Cr and Au metal films act as a mask and the tuning fork shaped configuration is formed.

The angle $\theta$ of rotation of quartz wafer 200 is set within the range of 15 to 20° for the following reasons. FIG. 3 is a graph showing the change of the electro-mechanical coupling coefficient ($K^2$) with angle $\theta$ and first order temperature coefficient (a) with angle $\theta$. Curve 300 represents $K^2$, which is shown on the left ordinate and curve 301 represents a which is shown on the right ordinate. The abscissa for both ordinates is angle $\theta$ from FIG. 2.

The absolute value of the first-order temperature coefficient "a" for quartz oscillators for measuring temperature in accordance with the invention should be as large as possible to increase the resolution (sensitivity) of the apparatus with respect to precise temperature measurement. As shown in curve 301 of FIG. 3, as the value of $\theta$ increases, the value of a increases. However, the CI value of the quartz oscillator should be as small as possible and should be stable despite changes in temperatures.

The CI value is inversely proportional to the electromechanical coupling coefficient $k^2$ and is at an optimum value when $\theta$ is approximately 15° in the range of $\theta = -90°$ to $+90°$. Therefore, an acceptable CI value is attained when $\theta = 15° \pm 10°$. When curve 301 is taken into consideration, it was determined that an acceptable value of $\theta$ for a quartz oscillator in accordance with the invention is in the range of 15°-25° which provides both an acceptable CI value and coefficient a. Over this range, a has values ranging from approximately $-15$ to $-33$ ppm/°C.

$K^2$ is a factor in determining the CI value in a flexural oscillation mode of a tuning fork shaped quartz oscillator. $K^2$ is expressed by the following formula:

$$K^2 = \frac{4\pi d_{12}^2}{S_{22}^E \epsilon_{11}^T}$$

wherein $d_{12}$, $S_{22}^E$ and $\epsilon_{11}^T$ represent various physical constants of an alpha quartz single crystal, $d_{12}$ represents the piezoelectric modulus tensor component of the electro-mechanical coupling coefficient; $S_{22}^E$ represents the elastic compliance tensor component of $K^2$ and $\epsilon_{11}^T$ represents the dielectric constant tensor component. When $\theta = 0$, these components assume the following values: $d_{12} = 6.88 \times 10^{-8}$ esu; $S_{22}^E = 12.7759 \times 10^{-13}$ cm$^2$/dyne; and $\epsilon_{11}\% = 4.5$.

Figure 4:
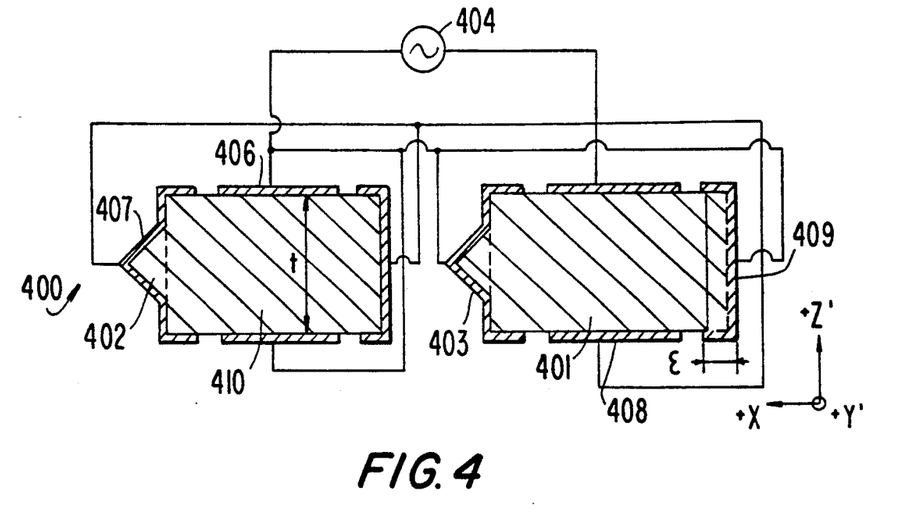
FIG. 4 is an end cross-sectional view of a quartz oscillator constructed in accordance with the invention.

An end cross-sectional view of a tuning fork shaped quartz oscillator 400 is shown in FIG. 4. Oscillator 400 includes a left arm 410 and a right arm 401. Arms 410 and 401 have a substantially rectangular cross-section. As shown in FIG. 4, arms 410 and 401 of an oscillator 400 can include a fin 402 and a fin 403 which are imperfections in arms 410 and 401, respectively. Fins 402 and 403 result from the photo-etching process. Fins 402 and 403 have a triangular cross-section.

Figure 10:
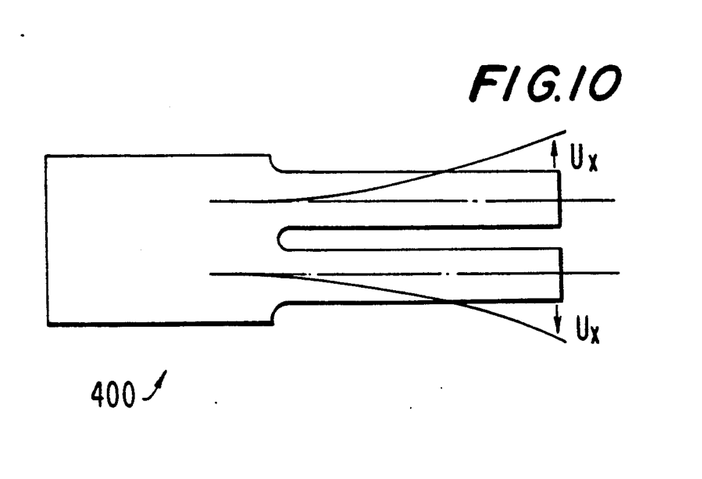
FIG. 10 is a plan view of a tuning forked shaped quartz oscillator showing an oscillation mode.

Oscillator 400 also includes a plurality of excitation electrodes 407, 408 and 409 on the surface thereof formed of the Cr underlayer and Au metal film. The Cr and Au metal films are formed along the longitudinal direction of arms 410 and 401 and are electrically coupled to a signal source 404 which provides electric signals to excite oscillator 400. Electrodes 406, 407, 408 and 409 are arranged to permit oscillator 400 to oscillate in its fundamental wave flexural oscillation mode as shown in FIG. 10.

A quartz oscillator sensor similar to sensor 100 of FIG. 1 was attached to a circuit board and used to measure temperature, the CI value was measured and it was determined that the CI value varied with the method used to fix the oscillator to the circuit board. These fluctuations in CI value were considered to be caused by a phenomenon commonly referred to as "leakage of oscillation energy". When this phenomenon occurs, displacement at the base 102 of tuning fork shaped oscillator 111 is transmitted through inner leads 104 of stem 103, into the body of stem 103 and into case 110 and causes case 110 to shake. Thus, the level of energy loss of sensor 100 can depend on how case 110 is fixed to the circuit board.

In order to evaluate the leakage of oscillation energy phenomenon, the relationship between the etching period of the photo-etching of the piece of quartz and the fluctuation characteristic of the CI value was examined during experiments conducted under the conditions of $\epsilon = 0$. As shown in FIG. 4, $\epsilon$ represents the increase in width between arm 401 and arm 410. The results of these experiments are shown in FIG. 5.

Figure 5:
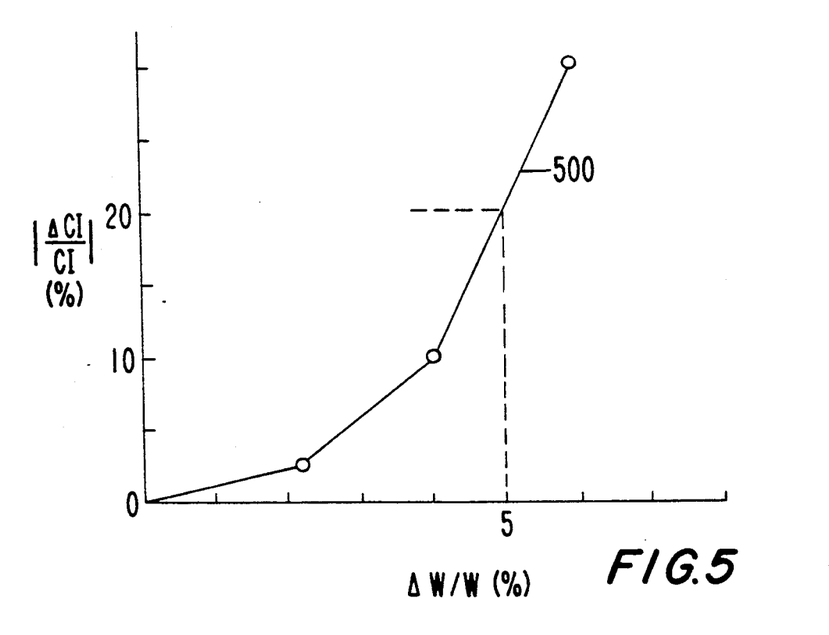
FIG. 5 is a graph showing the change in CI value with amount of fin imperfections.

FIG. 5 shows the effect of fin area on CI value. The abscissa represents the ratio of $\Delta w$ to $w$, in which $\Delta w$ represents the increase in arm width ($\mu$m) caused by fins present on the arms and $w$ represents the correct arm width. The ordinate represents the percentage ratio of fluctuation in CI value to CI value. $\Delta w$, the fin equivalent increase in arm width is calculated in the following manner. Fins 402 and 403 shown in FIG. 4 have substantially the same cross-sectional area S. $\Delta w = S/t$, wherein t is the thickness of the quartz wafer.

Curve 500 of FIG. 5 shows that the amount of fins present on the oscillator should be reduced so that the ratio of $\Delta w/w$ is not more than about 5% and preferably not more than about 4% in order to achieve a suitably stable CI value. When $\Delta w/w$ is about 5%, $\Delta CI/CI$ is about 20%.

Figure 6:
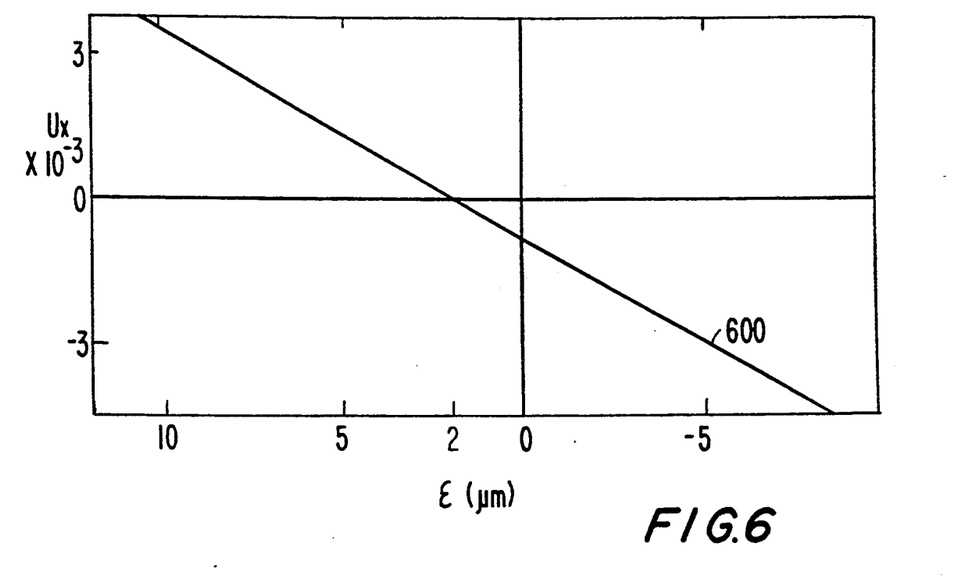
FIG. 6 is a graph showing the change in displacement of the base portion of the crystal along the X-axis of FIG. 4, with the change in difference between the widths of the arms of the tuning quartz oscillator.

Further analysis calculated by employing a finite element method yielded the following results shown in FIG. 6. The abscissa of FIG. 6 represents the difference between the widths of arms 410 and 401 of quartz oscillator 400 and is represented by the symbol $\epsilon$ (see FIG. 4). The ordinate represents the amount of displacement of base portion 102 of oscillator 111 in the width wise direction (the direction indicated by the $+X$ axis in FIG. 4) and is represented by the symbol Ux. Curve 600, which depicts $\epsilon$ vs. Ux was calculated from a quartz tuning fork with a fin amount such that $\Delta w/w$ had a ratio of 4.3%. As shown by curve 600, when $\epsilon$ was $\pm 2$ $\mu$m, Ux was equal to 0. Therefore, by adjusting the value of $\epsilon$, it is possible to eliminate fluctuation of the CI value due to oscillation leakage caused by displacement of the base portion of the tuning fork shaped oscillator by configuring the oscillator to minimize the fluctuation. A quartz tuning fork oscillator was constructed with the above dimensions and acceptable results were obtained.

Figure 7:
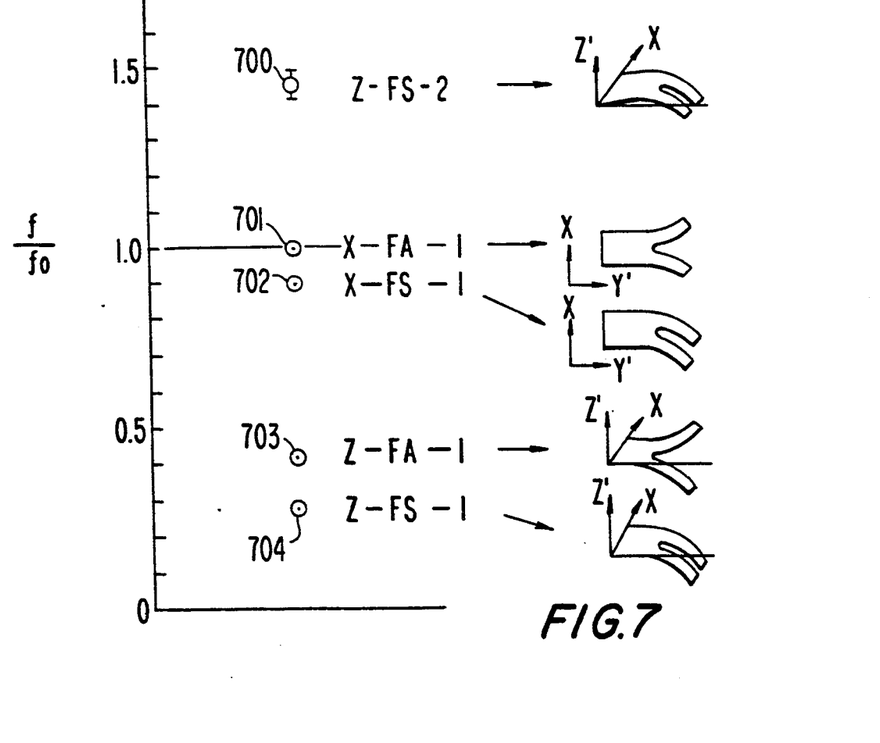
FIG. 7 is a mode chart of a quartz tuning fork oscillator.
Figure 8:
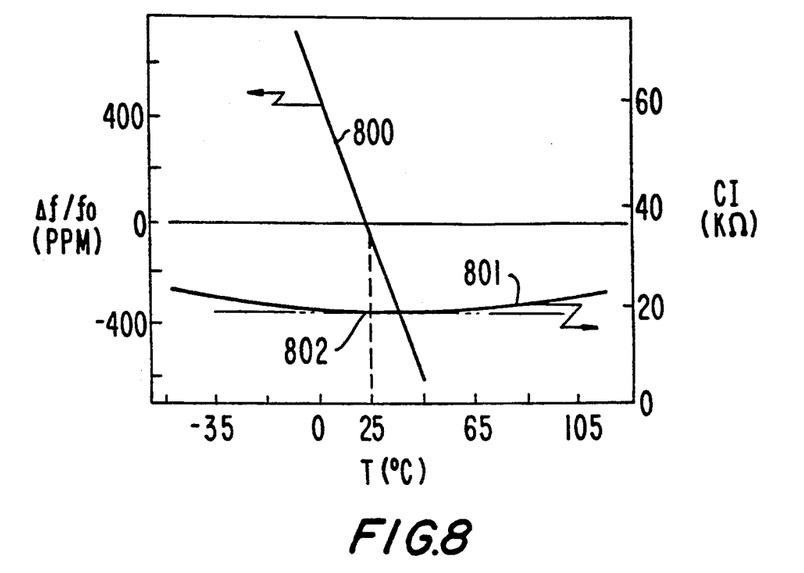
FIG. 8 is a graph showing the change of both the equivalent series-resistance characteristic and the frequency characteristic, with the change in temperature, of a quartz oscillator constructed in accordance with the invention.

The tuning fork shaped configuration and the dimensions of the quartz are based in part on the characteristics shown in FIGS. 7 and 8. FIG. 7 is referred to as a mode chart. The eigen resonance frequency $f_0$ of the fundamental wave flexural oscillation mode formed with a selected dimensional condition was used as a reference and the ratio of the frequency of other oscillation modes ($f_0$) with respect to the reference frequency f is plotted along the ordinate ($f/f_0$).

A data point 700 indicates the frequency ratio of a second order in-phase flexural oscillation mode denoted Z-FS-2 having displacement Uz perpendicular to the principle plane of the quartz tuning fork. A data point 701 represents the frequency ratio for a fundamental wave flexural oscillation mode denoted X-FA-1 having a displacement Ux, as shown in FIG. 10. This is the intended mode of oscillation for the tuning fork. A data point 702 indicates the frequency ratio of an oscillation mode, denoted X-FS-1, in which the left and right arms of the quartz tuning fork oscillate in the same direction, in synchronization with each other. A data point 703 indicates the frequency ratio of an oscillation mode similar to that represented by data point 700, but in which the left and right arms are displaced in opposite z directions in asynchronization, denoted Z-FA-1. A data point 704 indicates the position of an oscillation mode similar to that represented by data point 703, but in which the left and right arms oscillate in the same z direction, in synchronization with each other, denoted Z-FS-1.

Referring to FIG. 7, it is important that over the operating temperature range, which is typically from about −50 to 100° C., the frequency of the tuning fork does not coincide with an unnecessary oscillation mode, even when the maximum first-order temperature coefficient "a" equals −33 ppm/°C. is adopted. This is because the fundamental wave flexural oscillation mode is selected instead of a higher-order oscillation mode. Because the frequency of positions 701 and 702 differs by about 10%, positions 701 and 702 are sufficiently distinct and provide a sufficiently separate frequency change with respect to temperature changes. This can be confirmed by calculation.

The relationship between various modes shown in the FIG. 7 mode chart is sufficiently possible if a tuning fork-shaped piece of quartz has proper dimensions. An acceptable tuning fork has a thickness of 80 to 150 $\mu$m; a ratio between thickness t of the arms (FIG. 4) and width w (FIG. 1) in the range of t:w=0.24:1 to 0.6:1; and a ratio between an interval c between the arms (FIG. 1) and width w in the range of c:w=0.3:1 to 0.6:1. It has been confirmed with a tuning fork constructed with these relationships that two immediately adjacent oscillation modes can have a frequency difference of more than about 8%. Consequently, abnormalities will not occur during temperature measurement due to coincidence with a spurious mode.

FIG. 8 shows the change of CI value and resonance frequency characteristic with temperature. The abscissa of FIG. 8 represents the ambient temperature T in °C. The left ordinate represents the frequency temperature characteristic in terms of the frequency change ratio ($\Delta f/f_0$). The right ordinate of FIG. 8 represents the CI value in K$\Omega$. Curve 800 shows the change in frequency characteristic with temperature and curve 801 shows the change in CI value with temperature.

It can be seen that curve 801 is in the form of an upwardly opening parabola that is symmetric with respect to its minimum, corresponding to a vertex temperature 802, in this case, 25° C. The change in vertex temperature with quartz wafer orientation and quartz arm configuration was analyzed; particularly, various ratios between arm width w and arm length L (see FIG. 1). It was determined that the vertex temperature will fall substantially within the range of 25° C., ±15° C., when the ratio w/L equals 0.1 to 0.2, while the quartz-wafer cutting orientation $\theta$=15−25°. The second-order temperature coefficient of the CI value was calculated and found to be 40.8 ppm/°C.$^2$. The CI value increases by 20%, considered to be a relatively small amount, within the temperature range 25°−95° C. An acceptable Quartz tuning fork 111 had the following dimensions: L=2520 $\mu$m, w=324 $\mu$m, t=130 $\mu$m and c=176 $\mu$m.

A quartz oscillator sensor such as sensor 100 can be constructed as follows. Stem 103 can have a substantially cylindrical body with a periphery formed of a metal such as covar. Leads 105 are disposed in parallel through the inside of stem 103 and the remainder of stem 103 is hermetically sealed by fusing glass. Case 110 is formed by deep-drawing a german silver plate of a Cu-Ni alloy with a press. Case 110 can be either plated with Ni or first plated with Ni and then plated with an additional layer of a heat-resistant solder. Stem 103, including inner leads 104 and outer leads 105 is coated with both a Cu or Ni underlayer plating and then a plating of heat-resistant solder. Quartz oscillator 100 is shown coated with a heat-resistant solder plating 108 and 109 and stem 103 is coated with heat-resistant solder plating 106.

Figure 9:
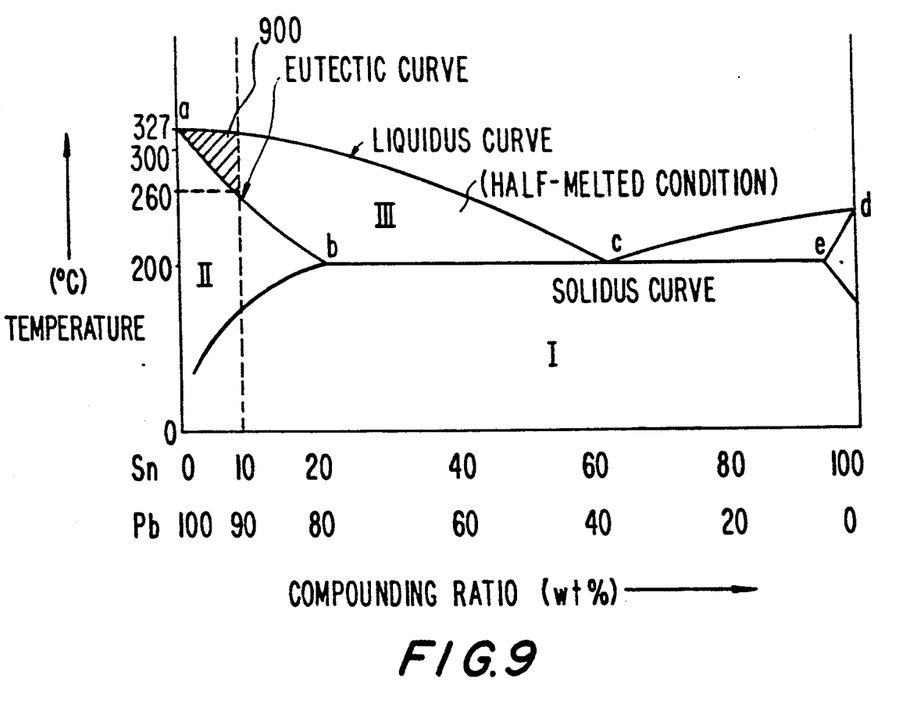
FIG. 9 is a graph showing the state of a Pb-Sn solder for use as a heat-resistent plating in accordance with the invention.

The heat-resistant solder platings have certain desirable characteristics which can be explained with reference to FIG. 9. FIG. 9 is a graph showing various conditions of a PbSn used in heat-resistant solder in accordance with the invention. The abscissa represents the compound ratio in weight percent of the lead and tin components of the solder. The ordinate represents the temperature. The heat-resistant solder used in accordance with the temperature-detecting quartz oscillator described herein should contain not less than 90 weight percent Pb and not more than 10 weight percent Sn. Such a heat-resistant solder should have a melting point of 260° C. This is sufficiently high for the usable operating range of a temperature-detecting quartz oscillator.

Quartz oscillator temperature sensor 100 is assembled in the following manner. The Cr and Au electrode films on the piece of quartz are maintained in contact with inner leads 104 of stem 103 and quartz 111 is adhered to inner leads 104 by a heating method employing a temperature of approximately 327° C. or higher. Thereafter, stem 103, which is attached to quartz 111, and case 110 is subjected to a high vacuum high temperature exposure within a temperature indicated by the hatched region of FIG. 9 to bring the heat-resistant solder into a half-melted condition and to cause any gas in the solder plating to exit. Thereafter, the temperature is decreased and the case and stem are pressed together to press-fit the two pieces together in a manner to accommodate quartz 111 in the hermetically sealed case. Thus, completed quartz oscillator 100 has a significantly small amount of gas remaining in the casing and is therefore capable of maintaining a high level of frequency precision.

Appropriate sizes for the components of quartz oscillator 100 are as follows: the diameter can be about 2 mm with a length of about 6 mm. Alternatively, the diameter can be approximately 1 mm with a length of 4 mm. It will be well understood by those of ordinary skill in the art that numerous other dimensional relationship are possible.

As described above, when the cutting orientation of a quartz wafer and the configuration and dimensions of a tuning fork-shaped piece of quartz are set appropriately, and the electrodes are formed and connected in a manner to enable oscillation in the fundamental wave flexural oscillation mode, a quartz oscillator for detecting temperatures according to the invention can be provided having a small equivalent series-resonance resistance (CI value) which varies only slightly with respect to changes in temperature. The frequency and CI value of the quartz oscillator do not become abnormal in a spurious phenomenon.

By reducing the amount of fins generated by outer-shape forming the quartz into the tuning fork-shaped configuration by a photo-etching method to a sufficiently small amount or by causing one of the arms of the tuning fork-shaped piece to have an appropriate difference in arm width from the other arm, the oscillation displacement of the base of the quartz tuning fork can be sufficiently reduced in order to reduce fluctuations in the CI value which can be caused, depending on the mounting condition of the quartz oscillator. This provides a highly stable quartz oscillator for detecting temperature.

By employing a heat-resistant solder plating and a highly hermetically sealed technique at high temperatures, it can be possible to provide a highly precise temperature-detecting quartz oscillator having a wide usable temperature range and a high level of frequency precision.

A sensor for detecting temperature includes a piece of quartz formed from a quartz wafer of a thickness of about 80–150 μm obtained by rotating the plane of a Z-cut wafer having a principal plane defined by an electrical axis (+X) and a mechanical axis (+Y) of an α quartz single crystal about the electrical axis (+X) in a clockwise direction by an angle of about 15°–25°. This range of rotation is selected to assure that the resulting oscillator has a substantially maximum electro-mechanical coupling coefficient.

The quartz should be in the shape of a tuning fork with a base and a pair of parallel arms extending from the base along a Y' axis, which is equivalent to the new mechanical axis of the wafer after the (+X)(+Y) plane is rotated about the (+X) axis. The arms should have dimensions in which the ratio of arm width to arm length is between 0.1:1 to 0.2:1.

The quartz tuning fork should be shaped by a photo-etching method in order to reduce the presence of fin shaped defects on the outer surface thereof. The excitation electrodes should be formed on the tuning fork in such a manner as to enable the tuning fork to oscillate in the fundamental wave oscillation mode. The tuning fork should be housed in a heat resistant case and hermetically sealed with a stem at an open end of the case. The oscillator should have an equivalent series-resonance resistance value whose characteristic with respect to temperature has a minimum vertex temperature that is substantially equal to room temperature (25°±15° C.).

The tuning fork should be formed by a photo-etching method to reduce the cross-sectional area of fins in such a manner that when the cross-sectional area of the fins is converted into an equivalent increase in arm width, the equivalent increase is not more than about 5%. If the presence of fins cannot be reduced sufficiently, the relative widths of the arms can be changed to improve the oscillation stability.

The tuning fork shaped quartz should be housed in a heat resistant housing that can be formed of a case and stem configuration. At least one portion of the case and the stem should be coated with a heat-resistant Pb-Sn solder containing not less than about 90 wt % Pb. An inner lead should pass through the stem and should have at least a portion plated with the heat resistant solder. The quartz tuning fork should be coupled to the leads by the heat resistant solder and the case and stem should be press combined with the heat resistant solder therebetween.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

We claim:

1. A method of forming a quartz oscillator temperature sensor, comprising:
   providing an α-quartz single crystal having an electrical axis (+X) perpendicular to a mechanical axis (+Y) and defining an XY plane and an optical axis (+Z) perpendicular to the XY plane;
   cutting a substantially flat wafer having a thickness between about 80 and 150 μm from the quartz crystal, the wafer cut in the plane obtained by rotating the XY plane about the (+X) axis in a clockwise (−Z) direction by an angle of about 15 to 25° to yield a plane defined by the +Y axis and a Y' axis defined as the (+Y) axis after rotation of the plane of the wafer about the (+X) axis;
   forming a tuning fork shaped piece of quartz having a base and a pair of parallel arms extending from the base from the wafer, in which the arms are parallel with a Y' axis;
   disposing excitation electrodes on the tuning fork; and
   enclosing the tuning fork within a housing.

2. The method of claim 1, wherein the arms are formed to have a ratio of arm length: arm width of between about 10:1 to 20:1.

3. The method of claim 1, wherein the tuning fork shaped piece of quartz is formed by a photo-etching method and steps are taken to reduce the presence of fin shaped defects on the outer surface of the tuning fork so that the increase in width of an arm caused by the fins is less than about 5%.

4. The method of claim 1, wherein the housing is formed of a heat resistant case having an open end and a stem sealing the open end and electrical leads are provided from the tuning fork through the stem to a location outside of the stem.

5. The method of claim 4, wherein a heat resistant solder is disposed on the case and on the stem at a location where the stem contacts the case and at the connection between the leads and the tuning fork, the heat resistant solder consisting essentially of Pb and Sn and not less than about 90% Pb.

6. The method of claim 5, wherein the case, tuning fork and stem are exposed to high vacuum and high temperature conditions to bring the heat resistant solder into a substantially half-melted condition and to cause gas to exit from the solder, then the temperature is decreased and the case and stem are press fit together to hermetically seal the quartz tuning fork within the case and stem with a high degree of vacuum present within the case.

7. The method of claim 2, wherein the width of one of the arms of the tuning fork is changed with respect to the width of the other to reduce displacement of the base of the tuning fork during oscillation.

* * * * *